United States Patent
Aoki et al.

(10) Patent No.: US 7,807,545 B2
(45) Date of Patent: Oct. 5, 2010

(54) METHOD FOR MANUFACTURING SIMOX WAFER

(75) Inventors: Yoshiro Aoki, Tokyo (JP); Yukio Komatsu, Tokyo (JP); Tetsuya Nakai, Tokyo (JP); Seiichi Nakamura, Tokyo (JP)

(73) Assignee: Sumco Corporation, Tokyo (JP)

( * ) Notice: Subject to any disclaimer, the term of this patent is extended or adjusted under 35 U.S.C. 154(b) by 322 days.

(21) Appl. No.: 11/670,636

(22) Filed: Feb. 2, 2007

(65) Prior Publication Data

US 2007/0178680 A1 Aug. 2, 2007

(30) Foreign Application Priority Data

Feb. 2, 2006 (JP) ............................ 2006-025373

(51) Int. Cl.
*H01L 21/76* (2006.01)
*H01L 21/265* (2006.01)
*H01L 21/31* (2006.01)
*H01L 21/469* (2006.01)

(52) U.S. Cl. ................. 438/407; 438/526; 438/766; 438/770; 257/E21.568

(58) Field of Classification Search ................ 438/407, 438/526, 766, 770; 257/E21.568, E21.09, 257/E21.483
See application file for complete search history.

(56) References Cited

U.S. PATENT DOCUMENTS

| | | | |
|---|---|---|---|
| 5,707,889 A * | 1/1998 | Hsu et al. ................ | 438/362 |
| 5,930,643 A | 7/1999 | Sadana et al. | |
| 6,784,072 B2 * | 8/2004 | Fox et al. ................. | 438/404 |
| 6,794,264 B2 * | 9/2004 | Dolan et al. .............. | 438/407 |
| 7,473,614 B2 * | 1/2009 | Tolchinsky et al. ....... | 438/407 |

FOREIGN PATENT DOCUMENTS

JP 07-263538 10/1995

OTHER PUBLICATIONS

English Language Abstract of JP 07-263538 (Oct. 13, 1995).
U.S. Appl. No. 11/677,282, filed Feb. 21, 2007, and entitled "Method for Manufacturing SIMOX Wafer".
U.S. Appl. No. 11/695,706, filed Apr. 3, 2007, and entitled "Method for Manufacturing SIMOX Wafer and SIMOX Wafer Obtained by this Method".

* cited by examiner

*Primary Examiner*—David S Blum
(74) *Attorney, Agent, or Firm*—Greenblum & Bernstein, P.L.C.

(57) ABSTRACT

A SIMOX wafer having a BOX layer with a thin film thickness is obtained without a reduction in productivity or deterioration in quality. In a method for manufacturing a SIMOX wafer comprising: a step of forming a first ion-implanted layer in a silicon wafer; a step of forming a second ion-implanted layer that is in an amorphous state; and a high-temperature heat treatment step of maintaining the wafer in an oxygen contained atmosphere at a temperature that is not lower than 1300° C. but less than a silicon melting point for 6 to 36 hours to change the first and the second ion-implanted layers into a BOX layer, a gas containing chlorine that is not less than 0.1 volume % but less than 1.0 volume % is mixed into an atmosphere during temperature elevation in the high-temperature heat treatment.

18 Claims, 3 Drawing Sheets

METHOD FOR MANUFACTURING SIMOX WAFER

BACKGROUND OF THE INVENTION

1. Field of the Invention

The present invention relates to a method for manufacturing a SIMOX (Separation by IMplanted OXygen) wafer based on a SIMOX technology among methods for manufacturing an SOI (Silicon On Insulator) wafer having a single-crystal silicon layer formed on a silicon single-crystal main body via an oxide film.

2. Description of the Related Art

As conventional methods for manufacturing an SOI wafer, there are known a bonding method for bonding two silicon wafers via an oxide film and a SIMOX method for implanting oxygen ($O^+$) ions from a silicon wafer surface to form an ion-implanted layer serving as an oxygen layer having a high concentration in a region at a predetermined depth in a wafer and applying a heat treatment to this wafer to change the ion-implanted layer into a buried oxide film (which will be referred to as a BOX layer hereinafter). In particular, an SOI wafer manufactured by the SIMOX method is called a SIMOX wafer.

A method for manufacturing a SIMOX wafer at an initial stage of development is based on a high-dose technology. In this method for manufacturing a high-dose SIMOX wafer, oxygen ions are implanted into a silicon wafer at the rate of approximately $2\times10^{18}$ atoms/cm$^2$ with an implantation energy of approximately 200 keV, a BOX layer is formed in the wafer in an ion-implanted state (as-implanted state), and then high-temperature annealing treatment is carried out. As a result, a crystal defect that has occurred in the SOI layer by this annealing treatment can be remedied, the BOX layer can be reformed, and an interface between the SOI layer and the BOX layer can be flattened.

However, since in this high-dose technology for manufacturing the SIMOX wafer an oxygen ion dose amount is large, there has been a problem that many threading dislocations occur in the SOI layer, an ion implantation time is long and a manufacturing efficiency is poor, for example. This threading dislocation brings a leak current or deterioration in a hetero-interface when a device is manufactured. As a result, an improvement in device performance or development of functionality may be obstructed.

Therefore, a low-dose technology has been developed in order to inhibit threading dislocations from being generated in an SOI layer and to reduce an ion implantation time. In this method for manufacturing a low-dose SIMOX wafer, oxygen ions are implanted from a surface of a silicon wafer at the rate of approximately $4\times10^{17}$ atoms/cm$^2$ with an implantation energy of approximately 180 keV, and then a high-temperature heat treatment is carried out to form a continuous BOX layer. In a case where the implantation energy is 180 keV, the BOX layer that is continuous in parallel to the silicon surface can be formed only when a dose amount is approximately $4\times10^{17}$ atoms/cm$^2$. This dose amount is called a dose window. In this low-dose technology for manufacturing the SIMOX wafer, a density of threading dislocations in the SOI layer can be reduced and an implantation time can be reduced to improve a manufacturing efficiency.

However, since in this low-dose technology for manufacturing the SIMOX wafer an oxygen ion dose amount is small, a film thickness of the BOX layer becomes thin resulting in a problem of reliability of the BOX layer. Further, in a case where a film thickness of the BOX layer to be formed is small, when a particle adheres to a silicon wafer surface at the time of ion implantation, this particle functions as a mask so that an unimplantable part is apt to be generated in the ion-implanted layer formed in the silicon wafer. Since the ion-implanted layer becomes the BOX layer by annealing treatment, the ion unimplantable part serves as a pin hole that is one type of crystal defects of the BOX layer to reduce electrical insulation properties. There has been a problem that a percentage of this pin hole density is higher than that of a high-dose SIMOX wafer, for example.

Thus, in order to inhibit generation of the pin hole in the BOX layer, there have been proposed a method for manufacturing an SOI substrate called an ITOX (Internal Thermal OXidation) technology where annealing treatment is performed to an ion-implanted silicon wafer and then oxidizing treatment is carried out in a high-temperature oxygen atmosphere, and an SOI substrate manufactured thereby (see, e.g., Japanese Unexamined Patent Application Publication No. 263538-1995 (claim 1, claim 3, claim 6, paragraphs [0009], [0010], [0025], and [0026], FIG. 1)).

In the method disclosed in Unexamined Patent Application Publication No. 263538-1995, an ion-implanted layer formed in a wafer is subjected to annealing treatment in an inert gas atmosphere containing oxygen having a concentration less than 1.0% to be changed into a BOX layer, and then this wafer is further subjected to high-temperature treatment in an atmosphere containing oxygen having a high concentration exceeding 1%. High-concentration oxygen in the atmosphere is diffused to the inside from front and back sides of the wafer by the high-temperature heat treatment, and stays to be laminated as $SiO_2$ at a BOX layer interface portion. As a result, the BOX layer grows, and a film thickness of the BOX layer can be increased. In this ITOX technology manufacturing a SIMOX wafer, since $SiO_2$ is laminated in the BOX layer, a pin hole generated in the BOX layer can be remedied, thus reducing a pin hole density. Further, root mean square roughness (Rms) of an interface between the BOX layer and the silicon wafer can be improved. As a result, electrical characteristics of a device can be homogenized.

However, even in this ITOX technology manufacturing SIMOX wafer, since an oxygen ion dose amount is large, an ion implantation time is long. Moreover, a high-temperature oxidizing treatment is required in addition to the annealing treatment, and hence there is a problem that the manufacturing efficiency is poor and the productivity is lowered.

Thus, in order to reduce the ion implantation time, there has been proposed a method for manufacturing an SOI wafer called an MLD (Modified Low Dose) technology where oxidizing treatment is applied to a wafer having two ion-implanted layers including an amorphous layer formed therein (see, e.g., a specification in U.S. Pat. No. 5,930,643 (claim 1, specification p. 1, a second column on the right side, ll. 5 to 43, FIG. 1(a))

In the method disclosed in U.S. Pat. No. 5,930,643, an ion is implanted while changing a temperature of a wafer to form two ion-implanted layers in different states, i.e., a high-concentration oxygen layer and an amorphous layer in the wafer, and a high-temperature oxidizing treatment is applied to the wafer in a mixed gas atmosphere.

Specifically, in a state where the silicon wafer is heated, oxygen ions are implanted at the rate of $2\times10^{17}$ atoms/cm$^2$ with an implantation energy of 185 keV to form a first ion-implanted layer as the high-concentration oxygen layer in the wafer. Then, in a state where this wafer is cooled, the oxygen ions are implanted at the rate of $3\times10^{14}$ atoms/cm$^2$ with the implantation energy of 185 keV to form a continuous second ion-implanted layer in an amorphous state on the first ion-implanted layer. Further, a temperature of this wafer is increased in an inert atmosphere, e.g., argon containing oxygen, and then high-temperature oxidizing treatment of maintaining the wafer at a high temperature in an oxidizing atmosphere containing oxygen and argon in the ratio of 40% to 60% is carried out. Maintaining the wafer at a high temperature in this oxidizing atmosphere changes the first ion-implanted layer into a BOX layer. Furthermore, the second ion-implanted layer partially overlaps the first ion-implanted layer, and hence the amorphous layer contains high-concentration oxygen. Therefore, re-crystallization of the second ion-implanted layer does not smoothly advance at the time of increasing a temperature in the inert atmosphere, and the second ion-implanted layer becomes a high-density defective layer including polycrystal, a twin crystal, or a stacking fault. Oxygen readily precipitates in a region in which this defective layer is formed. In a subsequent process of maintaining the wafer at a high temperature in the oxidizing atmosphere, oxygen in the atmosphere enters the wafer from front and back sides of the wafer to be dispersed inside, and oxygen is concentrated in the high-density defective layer topresipitate, thereby forming the BOX layer. Therefore, a small ion dose amount allows acquisition of a SIMOX wafer having a BOX layer whose thickness is the same as that obtained when implanting a double dose amount.

However, in the manufacturing method disclosed in U.S. Pat. No. 5,930,643, oxygen in the oxidizing atmosphere during the high-temperature oxidizing treatment is apt to be precipitated in the high-density defective layer, and a SIMOX wafer having a BOX layer with a thin film thickness demanded by a semiconductor device manufacturer is hard to be manufactured.

As a countermeasure, a temperature in the high-temperature oxidizing treatment is further increased to resolve oxygen precipitated in the high-density defective layer, or an oxygen concentration in the oxidizing atmosphere is lowered to reduce an amount of oxygen concentrated in the high-density defective layer, whereby an oxygen precipitation amount is reduced, thus forming a BOX layer with a thin film thickness. However, considering performance of a current anneal furnace, when a high-temperature treatment is carried out at a temperature exceeding 1350° C., a high-quality SIMOX wafer is hard to be manufactured. Moreover, when an oxygen concentration in the oxidizing atmosphere is lowered, an oxidizing treatment time becomes longer in order to obtain an SOI layer having a predetermined film thickness, resulting in a problem that a manufacturing efficiency is deteriorated and productivity is decreased.

SUMMARY OF THE INVENTION

An object of the present invention is to provide a method for manufacturing a SIMOX wafer having a BOX layer with a thin film thickness without a reduction in productivity or deterioration in quality.

As shown in FIG. 1, the invention according to claim 1 is an improvement in a method for manufacturing a SIMOX wafer, the method sequentially comprising: a step of implanting oxygen ions from a surface of a silicon wafer 11 at the rate of $5 \times 10^{16}$ to $3 \times 10^{17}$ atoms/cm$^2$ in a state where the wafer 11 is heated to a temperature in the range of 200 to 600° C. to form a first ion-implanted layer (12) at a predetermined depth in the wafer 11; a step of implanting the oxygen ions from the surface of the wafer 11 at the rate of $1 \times 10^{14}$ to $1 \times 10^{16}$ atoms/cm$^2$ in a state where the wafer 11 having the first ion-implanted layer 12 formed therein is cooled to a temperature in the range from a room temperature to 200° C. to form a second ion-implanted layer 13 in an amorphous state at a predetermined depth in the wafer 11 in such a manner that the second ion-implanted layer 13 becomes continuous with the first ion-implanted layer 12 on a front surface side of the wafer 11; and a high-temperature heat treatment step of maintaining the wafer 11 in an atmosphere containing oxygen at a temperature that is not lower than 1300° C. but lower than a silicon melting point for 6 to 36 hours to change the first and the second ion-implanted layers 12 and 13 into a BOX layer 15.

Its characteristic constitution lies in that a gas containing chlorine that is not less than 0.1 volume % but less than 1.0 volume % (HCl, Cl$_2$, trichloroethylene, trichloroethane, or the like) is mixed into the atmosphere at the time of temperature elevation in the high-temperature heat treatment.

According to the method defined in claim 1, since a gas containing chlorine that is not lower than 0.1 volume % but less than 1.0 volume % is mixed into the atmosphere at the time of temperature elevation in the high-temperature heat treatment, a SIMOX wafer having the BOX layer 15 with a thin film thickness can be manufactured without a reduction in productivity or deterioration in quality.

DETAILED DESCRIPTION OF THE PREFERRED EMBODIMENTS

Embodiments of the present invention will now be described hereinafter with reference to the accompanying drawings.

Figure 1:
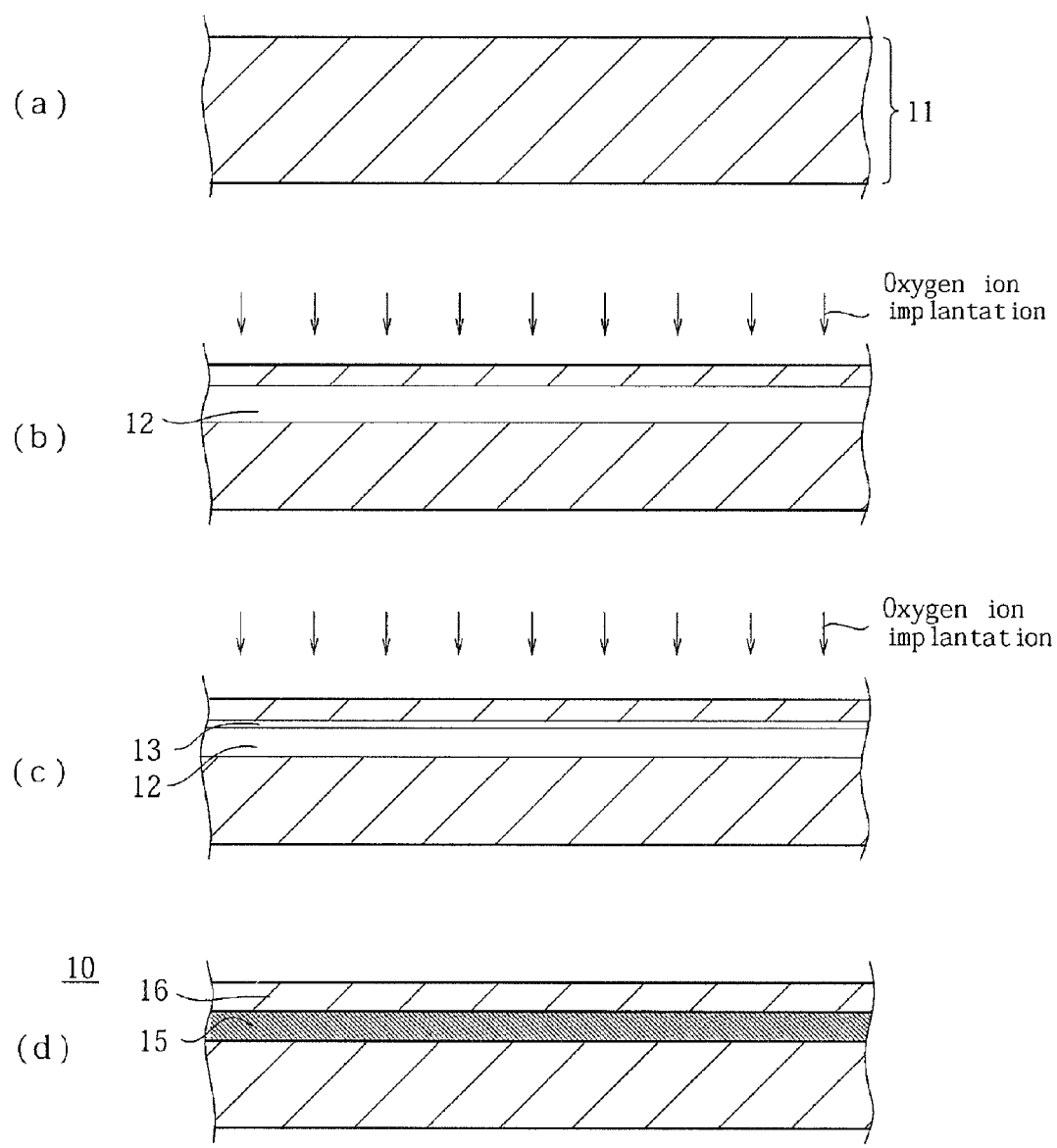
FIG. 1 is a view showing a method for manufacturing a SIMOX wafer according to an embodiment of the present invention in the step order.

As shown in FIG. 1, a method for manufacturing a SIMOX wafer according to the present invention includes: a step of implanting oxygen ions from a surface of a silicon wafer 11 (FIG. 1($a$)) to form a first ion-implanted layer 12 in the wafer 11 (FIG. 1($b$)); a step of implanting the oxygen ions from the surface of this wafer 11 to form a second ion-implanted layer 13 in an amorphous state in such a manner that the second ion-implanted layer 13 becomes continuous with the first ion-implanted layer 12 on a front surface side of the wafer (FIG. 1($c$)); and a high-temperature heat treatment step of applying a heat treatment to the wafer 11 in an atmosphere containing oxygen to change the first and the second ion-implanted layers 12 and 13 into a BOX layer 15 (FIG. 1($d$)).

This method for manufacturing the SIMOX wafer will now be explained with respect to each step.

<First Ion-Implanted Layer Forming Step>

As shown in FIGS. 1($a$) and 1($b$), oxygen ions are first implanted from the surface of the silicon wafer 11 to form the first ion-implanted layer 12 in the wafer 11. It is preferable for the silicon wafer 11 shown in FIG. 1($a$) to be manufactured based on a Czochralski method.

The first ion-implanted layer 12 is formed as follows. The silicon wafer 11 consisting of single-crystal silicon is accommodated in an ion implanter (not illustrated), and the oxygen ions are implanted from the surface of the wafer 11 in a state where the inside of the implanter is heated to a temperature in the range of 200 to 600° C. or, preferably, 300 to 500° C. as shown in a region (a) in FIG. 3. An atmosphere in the implanter is a vacuum state. Further, when the inside of the implanter is heated to a temperature in the range of 200 to 600° C., the ion can be implanted while maintaining a single-crystal silicon state on the wafer surface, and thus the first ion-implanted layer as a high-concentration oxygen layer can be formed while remedying a damage due to ion implantation. When the temperature is less than 200° C., since the damage due to ion implantation cannot be remedied, the damage remains in the first ion-implanted layer. When the temperature exceeds 600° C., since a degasification amount is large, an inconvenience that a degree of vacuum in the implanter is lowered occurs.

Here, a dose amount of the oxygen ion is $5 \times 10^{16}$ to $3 \times 10^{17}$ atoms/cm$^2$ or, preferably, $1 \times 10^{17}$ to $1.5 \times 10^{17}$ atoms/cm$^2$. The dose amount is limited to the range of $5 \times 10^{16}$ to $3 \times 10^{17}$ atoms/cm$^2$ for the following reason. When this dose amount is less than $5 \times 10^{16}$ atoms/cm$^2$, since the dose amount is small, an inconvenience that the continuous BOX layer is hard to be formed occurs. When the dose amount exceeds $3 \times 10^{17}$ atoms/cm$^2$, an inconvenience that a thickness of the BOX layer 15 formed in the subsequent high-temperature heat treatment is increased occurs.

Further, the implantation energy is 40 to 220 keV or, preferably, 140 to 180 keV. Here, the implantation energy is limited to the range 40 to 220 keV for the following reason. When the implantation energy is less than 40 keV, since ion implantation is shallow, an inconvenience that the SOI layer 16 with a predetermined film thickness cannot be formed occurs. When the implantation energy exceeds 220 keV, a special ion implanter is required.

As a result, the first ion-implanted layer 12 as an ion-implanted layer is formed at a position of a depth 100 to 600 nm or, preferably, 300 to 400 nm from the wafer surface in parallel with the wafer surface.

<Second Ion-Implanted Layer Forming Step>

Then, as shown in FIG. 1(c), the oxygen ions are implanted from the surface of the wafer 11 to form the second ion-implanted layer 13 that is in an amorphous state at a predetermined depth in the wafer 11 in such a manner that the second ion-implanted layer 13 becomes continuous with an upper interface of the first ion-implanted layer 12.

Figure 3:
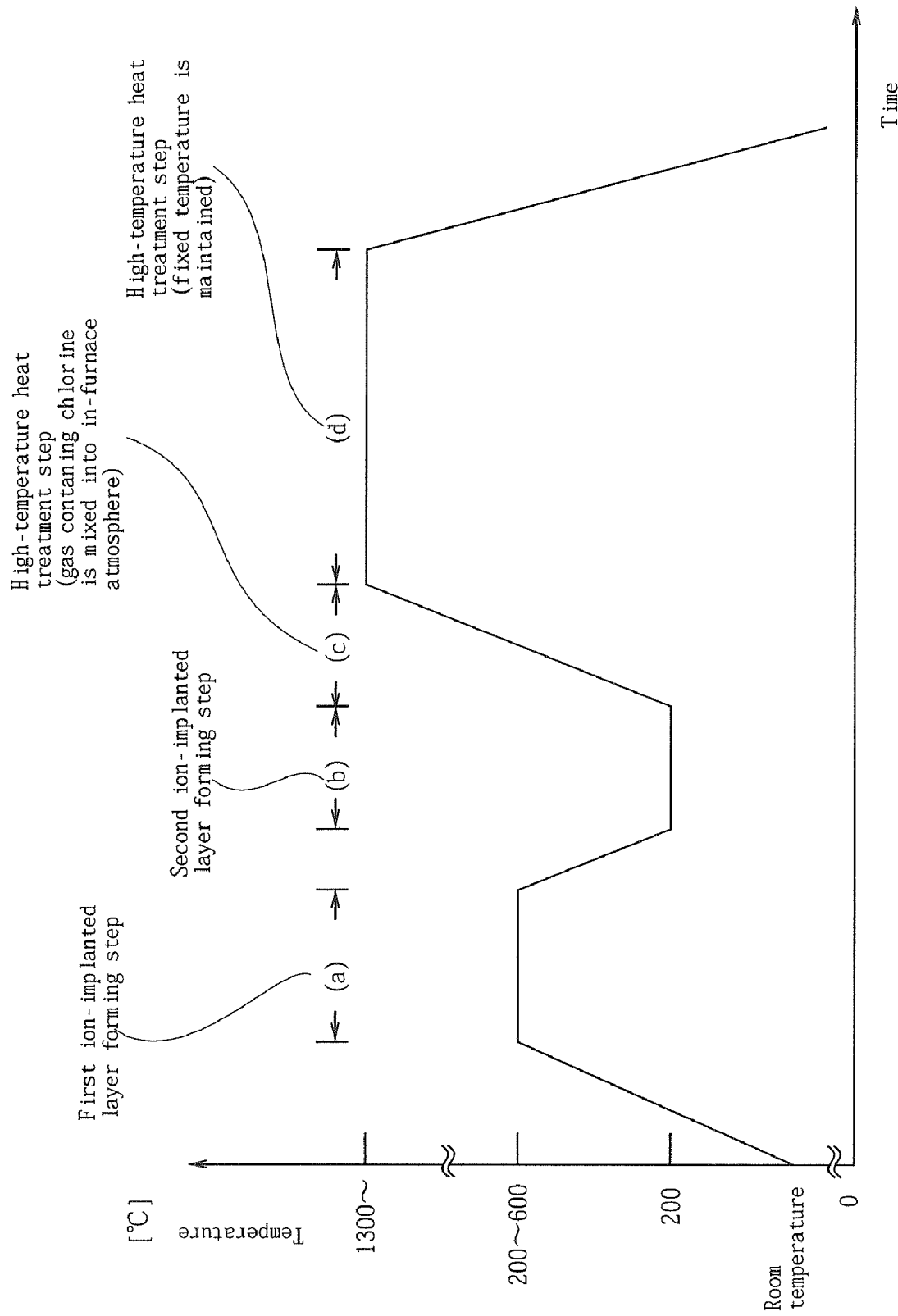
FIG. 3 is a view showing a profile of a temperature and a time corresponding to FIGS. 1($a$) to 1($d$).

The second ion-implanted layer 13 is formed by implanting the oxygen ions from the surface of the wafer 11 in a state where a temperature in the ion implanter (not illustrated) accommodating the wafer 11 having the first ion-implanted layer 12 formed therein is lowered to a range of a room temperature to 200° C. or, preferably, 100 to 150° C. as shown in a region (b) in FIG. 3. Moreover, when the in-implanter temperature is lowered to the range of a room temperature to 200° C., especially in a range of a room temperature, i.e., 20 to 30° C., a damage due to ion implantation remains without being remedied. When such a damage is accumulated, the single-crystal state is completely destroyed, and the second ion-implanted layer 13 changes to the amorphous state. Additionally, in a range of 100 to 150° C. in particular, a thickness of the second ion-implanted layer 13 to be formed becomes small.

A dose amount of the oxygen ion in this embodiment is $1 \times 10^{14}$ to $1 \times 10^{16}$ atoms/cm$^2$ or, preferably $1 \times 10^{15}$ to $1 \times 10^{16}$ atoms/cm$^2$. The second ion-implanted layer 13 overlaps an upper portion of the first ion-implanted layer 12. Therefore, the continuous BOX layer can be formed. Here, the dose amount is limited to the range of $1 \times 10^{14}$ to $1 \times 10^{16}$ atoms/cm$^2$ for the following reason. When the dose amount is less than $1 \times 10^{14}$ atoms/cm$_2$, an inconvenience that the second ion-implanted layer 13 that is in the amorphous state cannot be formed occurs. When the dose amount exceeds $1 \times 10^{16}$ atoms/cm$^2$, an inconvenience that a thickness of the second ion-implanted layer 13 is increased occurs.

Additionally, the implantation energy is 40 to 220 keV or, preferably, 140 to 180 keV. Here, the implantation energy is limited to the range of 40 to 220 keV for the following reason. When the implantation energy is less than 40 keV, since ion implantation is shallow, an inconvenience that the SOI layer 16 having a predetermined film thickness cannot be formed occurs. When the implantation energy exceeds 220 keV, a special ion implanter is required.

As a result, the second ion-implanted layer 13 that is in the amorphous state is formed at a position of a depth of 100 to 400 nm or, preferably, 300 to 400 nm from the wafer surface between the first ion-implanted layer 12 and the wafer surface in parallel with the wafer surface in such a manner that it is in continues with the first ion-implanted layer 12 or has an overlapping portion.

<High-Temperature Heat Treatment Step>

Figure 2:
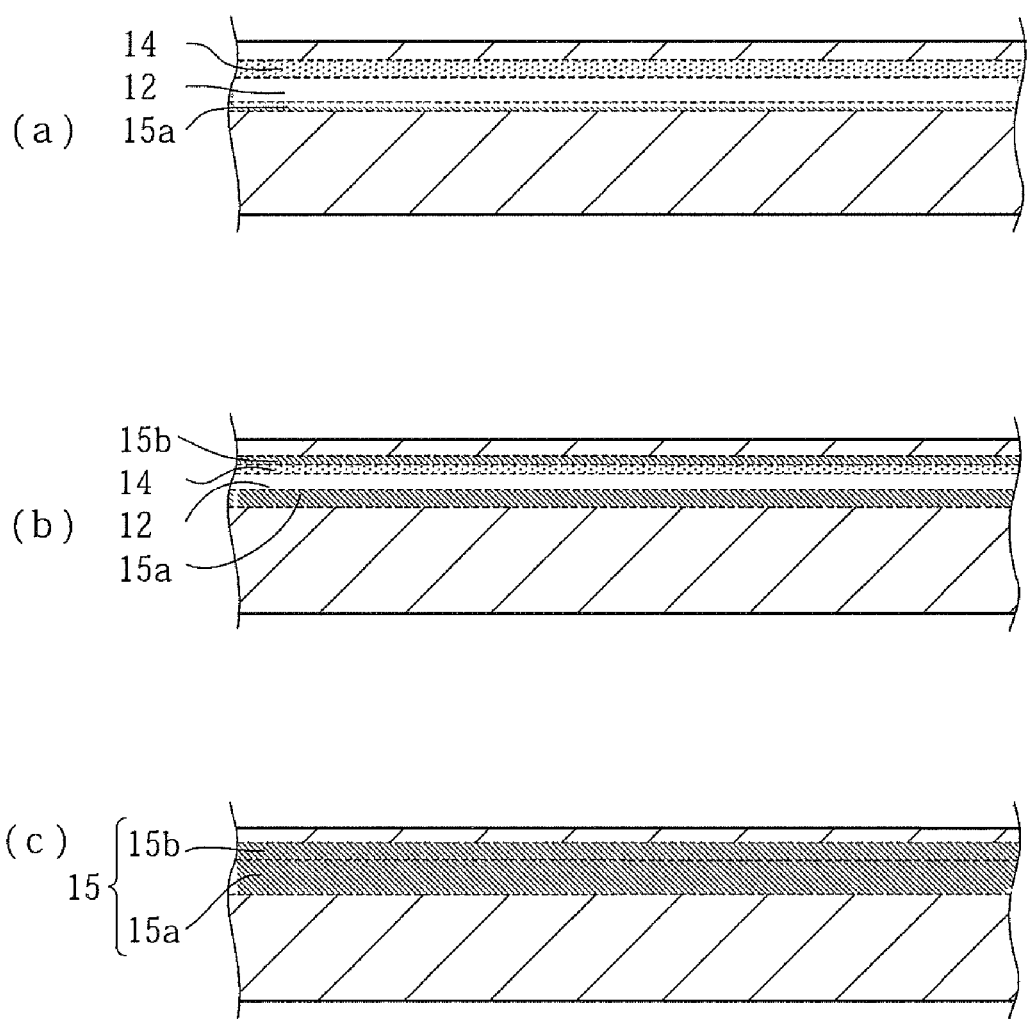
FIG. 2 is a view showing a change in the wafer when a high-temperature heat treatment according to the present invention is applied.

Then, as shown in FIG. 1(d), at the high-temperature heat treatment step, a heat treatment is applied to the wafer 11 in an atmosphere containing oxygen to change the first and the second ion-implanted layers 12 and 13 into the BOX layer 15. As shown in FIG. 2(c), the BOX layer 15 is constituted of a lower first BOX layer 15a and an upper second BOX layer 15b. The first BOX layer 15a and the second BOX layer 15b are formed by increasing a temperature of an anneal furnace (not illustrated) accommodating the wafer 11 having the first ion-implanted layer 12 and the second ion-implanted layer 13 formed therein to a predetermined temperature and maintaining the wafer 11 at the predetermined temperature for a fixed time.

Giving a specific explanation about a high-temperature heat treatment step, an in-furnace is heated to a temperature that is not lower than 1300° C. but less than a silicon melting point or, preferably, 1320 to 1350° C. as shown in a region (c) in FIG. 3. Then, the wafer 11 is maintained at this temperature for 6 to 36 hours or, preferably, 12 to 24 hours as shown in a region (d) in FIG. 3. Subsequently, the temperature of the SIMOX wafer 10 is lowered to a room temperature. Here, the in-furnace temperature is limited to the range that is not lower than 1300° C. but less than the silicon melting point for the following reason. When the temperature is less than 1300° C., since melting and coupling of oxygen precipitates are insufficient, an inconvenience that the high-quality BOX layer 15 cannot be formed occurs. Further, the holding time is limited to 6 to 36 hours for the following reason. When the holding time is less than 6 hours, since melting and coupling of the oxygen precipitates are insufficient, an inconvenience that the high-quality BOX layer 15 cannot be formed occurs. When the holding time exceeds 36 hours, a manufacturing efficiency is deteriorated, and an inconvenience that productivity is lowered occurs.

As shown in FIG. 2(a), when a temperature elevation starts, oxygen precipitates grow from a lower side of the first ion-implanted layer 12 as a high-concentration oxygen layer, and this layer starts to alter into the first BOX layer 15a. Further, the second ion-implanted layer 13 in an amorphous state starts to change into a high-density defective layer 14 containing an oxidation induced stacking fault layer (OSF). A characteristic constitution according to the present invention lies in that a gas containing chlorine that is not less than 0.1 volume % but less than 1.0 volume % (HCl, Cl$_2$, trichloroethylene, trichloroethane, or the like) is mixed into the atmosphere at the time of temperature elevation in the high-temperature heat treatment.

An in-furnace atmosphere during the temperature elevation is obtained by further mixing a gas containing chlorine of 0.1 to 1.0 volume % or, preferably, 0.2 to 0.5 volume % into a mixed atmosphere of an inert gas, e.g., argon or nitride ($N_2$) containing oxygen. The in-furnace atmosphere is controlled based on a mass flow. When the gas containing chlorine is mixed, an oxidation induced stacking fault can be reduced or eliminated by an effect that an interstitial silicon atom concentration is lowered due to vacancies produced when forming Si—Cl coupling based on a reaction of Cl and Si, thereby inhibiting growth of the high-density defective layer 14 including the oxidation induced stacking fault. A content of the gas containing chlorine is limited to 0.1 to 1.0 volume % for the following reason. When the content is less than 0.1 volume %, growth of the oxidation induced stacking fault cannot be inhibited, and the second BOX layer 15b with a thin film thickness cannot be obtained. When the content exceeds 1.0 volume %, the oxidation induced stacking fault itself is eliminated, and the second BOX layer 15b having a predetermined film thickness cannot be obtained.

An in-furnace atmosphere after the temperature elevation is an oxidizing atmosphere of an oxygen gas having a content of 5.0 to 100.0 volume % or, preferably, 10 to 50 volume % that contains an inert gas such as argon or nitrogen. During high-temperature maintenance in the oxidizing atmosphere, oxygen in the oxidizing atmosphere is concentrated in the high-density defective layer 14 containing the oxidation induced stacking fault to be precipitated. As a result, as shown in FIGS. 2(b) and 2(c), the high-density defective layer 14 containing the oxidation induced stacking fault is changed into the second BOX layer 15b that is continuous with the first BOX layer 15a. Here, the content of oxygen is limited to the range of 5.0 to 100 volume % for the following reason. That is, when the content is less than 5.0 volume %, a concentration of oxygen that is diffused in the wafer 11 is low, and an inconvenience that the high-quality BOX layer 15 cannot be formed occurs.

As a result, the first BOX layer 15a and the second BOX layer 15b are formed. As described above, the SIMOX wafer 10 having the BOX layer 15 with a thin film thickness can be obtained based on the manufacturing method according to the present invention without a reduction in productivity or deterioration in quality.

EXAMPLES

Examples according to the present invention will now be explained in detail together with comparative examples.

Example 1

As shown in FIG. 1, a silicon wafer 11 formed of a P-type silicon wafer having a diameter of 200 mm, a crystal orientation of <100>, and a specific resistance of 10 to 20 Ωcm was first prepared. Then, after accommodating the wafer 11 in the ion implanter, the inside of the implanter was changed to a vacuum state, and a temperature in the implanter was increased to 400° C. Subsequently, oxygen ions ($O^+$) were implanted from a surface of the wafer 11 in a dose amount of $2.4 \times 10^{17}$ atoms/cm$^2$ with an implantation energy of 210 keV to form a first ion-implanted layer 12 in the silicon wafer 11.

Then, the inside of the implanter was cooled to a room temperature, and the oxygen inos ($O^+$) were implanted from the surface of the silicon wafer 11 in dose amount of $2.0 \times 10^{15}$ atoms/cm$^2$ with the implantation energy of 210 keV to form a second ion-implanted layer 13 in such a manner that the second ion-implanted layer 13 partially overlaps the first ion-implanted layer 12 on a front surface side of the wafer.

Subsequently, after the silicon wafer 11 is accommodated in a horizontal furnace, an argon-rich gas atmosphere containing hydrochloric gas of 0.2 volume % and oxygen of 1 volume % was filled in the furnace based on a mass flow. Then, an in-furnace temperature was increased to 1320° C. at a temperature elevating speed of 0.5° C./minute. After the in-furnace temperature reached 1320° C., the in-furnace atmosphere was controlled to contain oxygen of 50 volume % and argon of 50 volume % based on the mass flow, thereby providing an oxidizing atmosphere.

The wafer 11 was held for 10 hours while maintaining the in-furnace atmosphere at 1320° C. in this oxidizing atmosphere. As a result, a SIMOX wafer 10 having a BOX layer 15 was obtained. This SIMOX wafer 10 is referred to Example 1.

Comparative Example 1

A SIMOX wafer 10 was obtained like Example 1 except that the in-furnace atmosphere during the temperature elevation was changed to an argon mixed gas atmosphere containing 0.02 volume % hydrochloric gas and 1 volume % oxygen. This SIMOX wafer 10 is referred to Comparative Example 1.

Example 2

A SIMOX wafer 10 was obtained like Example 1 except that the implantation energy at the first ion-implanted layer forming step was changed to 160 keV, the dose amount of the oxygen ions were changed to $2.5 \times 10^{17}$ atoms/cm$^2$, the implantation energy at the second ion-implanted layer forming step was changed to 160 keV, and the dose amount of the oxygen ions were change to $1.5 \times 10^{15}$ atoms/cm$^2$. This SIMOX wafer 10 was determined as Example 2.

Comparative Example 2

A SIMOX wafer 10 was obtained like Example 2 except that the in-furnace atmosphere during the temperature elevation was changed to an argon mixed gas atmosphere containing 0.02 volume % hydrochloric gas and 1 volume % oxygen. This SIMOX wafer 10 was determined as Comparative Example 2.

<Comparative Test and Evaluation>

Table 1 shows manufacturing conditions of Examples 1 and 2 and Comparative Examples 1 and 2. Thicknesses of an SOI layer and a BOX layer in the SIMOX wafer, the SOI layer surface roughness Rms, and breakdown voltage characteristics of the BOX layer according to each of Examples 1 and 2 and Comparative Examples 1 and 2 were examined. Further, the SOI layer in each SIMOX wafer was removed to evaluate interface roughness Rms of the SOI layer and the BOX layer. For the evaluation of roughness, an AFM (Atomic Force Microscope; SPA-360; manufactured by Seiko Instruments Inc.) was used. Table 2 shows this result.

TABLE 1

|  | Dose amount for 1st ion-implanted layer (atoms/cm$^2$) | Implantation energy for 1st ion-implanted layer (keV) | Dose amount for 2nd ion-implanted layer (atoms/cm$^2$) | Implantation energy for 2nd ion-implanted layer (keV) | HCl content in atmosphere during temperature elevation (volume %) |
| --- | --- | --- | --- | --- | --- |
| Example 1 | $2.4 \times 10^{17}$ | 210 | $2.0 \times 10^{15}$ | 210 | 0.2 |
| Example 2 | $2.5 \times 10^{17}$ | 160 | $1.5 \times 10^{15}$ | 160 | 0.2 |
| Comparative Example 1 | $2.4 \times 10^{17}$ | 210 | $2.0 \times 10^{15}$ | 210 | 0.02 |
| Comparative Example 2 | $2.5 \times 10^{17}$ | 160 | $1.5 \times 10^{15}$ | 160 | 0.02 |

TABLE 2

|  | SOI layer thickness (nm) | BOX layer thickness (nm) | SOI layer surface roughness (Å) | Interface roughness between SOI layer and BOX layer (Å) | Breakdown voltage characteristics of BOX layer (MV/cm) |
| --- | --- | --- | --- | --- | --- |
| Example 1 | 154.4 | 102.6 | 4.0 | 6.6 | 6.1 |
| Example 2 | 60.8 | 141.0 | 6.5 | 5.8 | 5.7 |
| Comparative Example 1 | 151.1 | 109.3 | 3.8 | 5.1 | 5.9 |
| Comparative Example 2 | 56.5 | 148.1 | 6.1 | 5.8 | 5.2 |

As apparent from Table 2, the SOI layer surface roughness Rms, the interface roughness Rms between the SOI layer and the BOX layer, and the breakdown voltage characteristics of the BOX layer of the wafer according to Example 1 in which hydrochloric of 0.2 volume % gas is contained in the in-furnace atmosphere during the temperature elevation were substantially equal to those of the wafer according to Comparative Example 1 in which hydrochloric gas of 0.02 volume %, which is 1/10 of the former content, is contained. However, the BOX layer in the wafer according to Example 1 was 6.7 nm thinner. Furthermore, comparing the BOX layer in the wafer according to Example 2 with that in the wafer according to Comparative example 2, the BOX layer in the wafer according to Example 2 was 7.1 nm thinner. It was revealed from the results of Examples 1 and 2 that mixing a gas containing chlorine in a range of 0.1 to 1.0 volume % into the in-furnace atmosphere during temperature elevation allows obtaining the SIMOX wafer having the BOX layer with a thin film thickness without a reduction in productivity or deterioration in quality.

What is claimed is:

1. A method for manufacturing a SIMOX wafer comprising the following sequential steps:
    forming a first ion-implanted layer at a first depth in a silicon wafer by heating the wafer at a temperature in the range from 200 to 600° C. and implanting oxygen ions from a surface of the wafer at the rate of $5 \times 10^{16}$ to $3 \times 10^{17}$ atoms/cm$^2$;
    cooling the wafer to a temperature in the range from room temperature to 200° C. and implanting oxygen ions from the surface of the wafer at the rate of $1 \times 10^{14}$ to $1 \times 10^{16}$ atoms/cm$^2$ to form a second ion-implanted layer that is in an amorphous state at a second depth in the wafer such that the second ion-implanted layer becomes continuous with the first ion-implanted layer on a front surface side of the wafer; and
    following the formation of the first ion-implanted layer and the second ion-implanted layer, performing a heat-treatment at an elevated temperature, wherein the elevated temperature during the heat-treatment is not lower than 1300° C. but less than the melting point of silicon while maintaining the wafer in an atmosphere containing oxygen and hydrochloric gas that is between 0.2 to 0.5 volume % mixed therewith during elevation of the temperature and maintaining the temperature for 6 to 36 hours to change the first and the second ion-implanted layers into a BOX layer.

2. The method of claim 1 wherein the temperature during formation of the first ion-implanted layer is in the range from 300 to 500° C.

3. The method of claim 1 wherein the oxygen ions are implanted at the rate of $1 \times 10^{17}$ to $1.5 \times 10^{17}$ atoms/cm$^2$ to form the first ion-implanted layer.

4. The method of claim 1 wherein an implantation energy of from 40 to 220 keV is used for the ion implantation step to form the first ion-implanted layer.

5. The method of claim 4 wherein implantation energy of from 140 to 180 keV is used for the ion implantation step to form the first ion-implanted layer.

6. The method of claim 1 wherein the first ion-implanted layer is formed at a first depth of 100 to 600 nm from the surface in parallel with the wafer surface.

7. The method of claim 6 wherein the first ion implanted layer is formed at a first depth of 300 to 400 nm from the surface in parallel with the wafer surface.

8. The method of claim 1 wherein the wafer is cooled to between 20 to 30° C.

9. The method of claim 1 wherein the oxygen ions are implanted at the rate of $1 \times 10^{15}$ to $1 \times 10^{16}$ atoms/cm$^2$ to form the second ion-implanted layer.

10. The method of claim 1 wherein implantation energy of from 140 to 180 keV is used to form the second ion-implanted layer.

11. The method of claim 1 wherein the second ion-implanted layer is formed at a depth of 100 to 400 nm from the wafer surface between the first ion-implanted layer and the wafer surface and in parallel with the wafer surface.

12. The method of claim 1 wherein the second ion-implanted layer is formed at a depth of 300 to 400 nm from the wafer surface between the first ion-implanted layer and the wafer surface and in parallel with the wafer surface.

13. The method of claim 1 wherein the temperature is elevated to between 1320 and 1350° C.

14. The method of claim 1 wherein the wafer is maintained at a temperature not lower than 1300° C. but less than the melting point of silicon for from 12 to 24 hours.

15. The method of claim 1 wherein the gas containing chlorine is mixed into a mixed atmosphere of an inert gas.

16. The method of claim 15 wherein the inert gas is argon or nitrogen containing oxygen.

17. The method of claim 1 wherein after the temperature elevation, the atmosphere is an oxidizing atmosphere of an oxygen gas having a content of from 5.0 to 100.0%.

18. The method of claim 17 wherein after the temperature elevation, the atmosphere is an oxidizing atmosphere of an oxygen gas having a content of from 10 to 50 volume %.

* * * * *